United States Patent
Yin

(10) Patent No.: US 12,287,665 B2
(45) Date of Patent: Apr. 29, 2025

(54) CLOCK CIRCUIT IN A PROCESSOR INTEGRATED CIRCUIT

(71) Applicant: HUAWEI TECHNOLOGIES CO., LTD., Guangdong (CN)

(72) Inventor: Wen Yin, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 125 days.

(21) Appl. No.: 17/947,699

(22) Filed: Sep. 19, 2022

(65) Prior Publication Data

US 2023/0013151 A1    Jan. 19, 2023

Related U.S. Application Data

(63) Continuation of application No. PCT/CN2021/076686, filed on Feb. 18, 2021.

(30) Foreign Application Priority Data

Mar. 23, 2020 (CN) .......................... 202010208897.2
Feb. 8, 2021 (CN) .......................... 202110172075.8

(51) Int. Cl.
  *G06F 1/08*      (2006.01)
  *G06F 1/06*      (2006.01)
  (Continued)

(52) U.S. Cl.
  CPC .................. *G06F 1/08* (2013.01); *G06F 1/06* (2013.01); *G06F 1/10* (2013.01); *G06F 1/3237* (2013.01);
  (Continued)

(58) Field of Classification Search
  CPC ..... G06F 1/04; G06F 1/06; G06F 1/08; G06F 1/10; G06F 1/3237; G06F 1/324;
  (Continued)

(56) References Cited

U.S. PATENT DOCUMENTS 8,736,342 B1    5/2014  Bucelot et al.
9,543,965 B1 *  1/2017  Ding .......................... H03L 7/04
(Continued)

FOREIGN PATENT DOCUMENTS

CN      104699531 A     6/2015
CN      105676944 A     6/2016
(Continued)

OTHER PUBLICATIONS

David Shan et al.,"Resonant Clock Mega-Mesh for the IBM z13TM", 2015 Symposium on VLSI Circuits Digest of Technical Papers, 978-4-86348-502-0, total 2 pages.
(Continued)

*Primary Examiner* — Patrick O Neill

(57) ABSTRACT

A clock circuit constructed in a processor integrated circuit includes a phase lock loop PLL, a clock tree, and a clock grid. The clock tree includes a plurality of clock buffers in a layered structure, The clock tree is configured to receive a first clock signal clk_1 that is output by the phase lock loop PLL, and to output a second clock signal clk_2. A plurality of child node circuits (400) are disposed on some nodes of the clock grid, and are configured to generate a third clock signal clk_3 based on the second clock signal clk_2. The clock grid (330) and the clock tree (320) are distributed on multiple dies in a three-dimensional structure of the processor integrated circuit.

12 Claims, 14 Drawing Sheets

(51) Int. Cl.
*G06F 1/10* (2006.01)
*G06F 1/3237* (2019.01)
*G06F 1/324* (2019.01)
*H01L 23/00* (2006.01)
*H01L 23/498* (2006.01)
*H03L 7/08* (2006.01)
*H01L 25/065* (2023.01)

(52) U.S. Cl.
CPC ........ *G06F 1/324* (2013.01); *H01L 23/49827* (2013.01); *H01L 24/13* (2013.01); *H03L 7/0802* (2013.01); *H01L 24/16* (2013.01); *H01L 24/17* (2013.01); *H01L 24/32* (2013.01); *H01L 24/33* (2013.01); *H01L 25/0657* (2013.01); *H01L 2224/13009* (2013.01)

(58) Field of Classification Search
CPC ......... H01L 24/13; H01L 24/16; H01L 24/17; H01L 24/32; H01L 24/33; H01L 25/0657
See application file for complete search history.

(56) References Cited

U.S. PATENT DOCUMENTS

| | | |
|---|---|---|
| 2002/0180502 A1 | 12/2002 | Aoki et al. |
| 2005/0114820 A1 | 5/2005 | Restle |
| 2009/0039492 A1 | 2/2009 | Kang et al. |
| 2013/0049824 A1* | 2/2013 | Kim .......................... H03L 7/00 327/141 |
| 2013/0049827 A1* | 2/2013 | Bucelot ..................... G06F 1/10 327/144 |
| 2014/0062564 A1* | 3/2014 | Sathe ........................ G06F 1/10 327/294 |
| 2014/0245250 A1 | 8/2014 | Hibbeler et al. |
| 2015/0234422 A1* | 8/2015 | Bucelot ..................... G06F 1/10 327/295 |
| 2015/0378388 A1* | 12/2015 | Franch ...................... G06F 1/10 327/293 |
| 2016/0173071 A1 | 6/2016 | Liau et al. |
| 2018/0308826 A1* | 10/2018 | Kawaminami ....... H01L 23/528 |

FOREIGN PATENT DOCUMENTS

| | | |
|---|---|---|
| CN | 105700617 A | 6/2016 |
| CN | 107817870 A | 3/2018 |
| CN | 110690858 A | 1/2020 |

OTHER PUBLICATIONS

J. Stinson, Intel Corporation, "Clock Distribution Techniques-Lecture 8",https://web.stanford.edu/class/archive/ee/ee371/ee371.1066/lectures/Old/Older/lect_08_ck_examples_1up.pdf, total 8 pages.

* cited by examiner

CLOCK CIRCUIT IN A PROCESSOR INTEGRATED CIRCUIT

CROSS-REFERENCE TO RELATED APPLICATIONS

This application is a continuation of International Application PCT/CN2021/076686, filed on Feb. 18, 2021, which claims priority to Chinese Patent Application 202110172075.8, filed on Feb. 8, 2021, and Chinese Patent Application 202010208897.2, filed on Mar. 23, 2020. All of the aforementioned patent applications are hereby incorporated by reference in their entirety.

TECHNICAL FIELD

This application relates to the circuit field, and in particular, to a clock circuit integrated into a processor integrated circuit.

BACKGROUND

A clock cycle is also referred to as an oscillation period and is defined as a reciprocal of a clock frequency. The clock cycle is a most basic and smallest time unit in a computer. In one clock cycle, a processor completes only one most basic action. The clock frequency is an important indicator of performance of the processor. In a design of the processor, if a quantity of operations completed in a same clock cycle remains unchanged, a shorter clock cycle and a higher clock frequency indicate better performance of the processor.

During physical implementation, a clock circuit inside the processor usually includes a phase lock loop (phase lock loop, PLL), a clock tree, or a clock network, and is then connected to clock pins of different registers.

With rapid development of computer technologies, a current typical high-performance processor integrates tens of billions of transistors, and a die size (die size) is close to 1000 mm$^2$. In a design of the clock circuit, as a die scale increases, the clock circuit is faced with problems of an insufficient drive capability, an increase in a stage quantity, and an increase in a delay and power consumption. Consequently, problems of a clock skew and a clock jitter become increasingly serious. Therefore, it is increasingly difficult to increase the clock frequency of the processor, and consequently performance of the processor cannot meet growing application requirements.

SUMMARY

This application provides a processor clock system, a child node circuit in a clock system, and an electronic device, to meet a requirement of an application scenario on clock frequency conversion of a clock circuit.

According to a first aspect, a processor clock system is provided, including a phase lock loop PLL, a clock tree, and a clock grid. The PLL is configured to output a first clock signal clk_1. The clock tree is configured to: receive the first clock signal clk_1, and output a second clock signal clk_2. The clock grid includes a plurality of nodes, some of the plurality of nodes each are provided with a child node circuit, and the child node circuit is connected to the clock tree, and is configured to generate a third clock signal clk_3 based on the second clock signal clk_2. The clock grid and the clock tree are of a three-dimensional structure.

The child node circuit includes a resonant and decoupling unit and a clock gating unit, the clock gating unit is configured to: receive a gating signal G and the second clock signal clk_2, and output the third clock signal clk_3 to the clock grid and the resonant and decoupling unit, and the resonant and decoupling unit includes a decoupling capacitor and a plurality of resonant inductors, and supports generation of a plurality of oscillation frequencies of different frequencies.

The child node circuit receives and processes the second clock signal clk_2 that is output by the clock tree, and outputs the third clock signal clk_3, to implement a gating function. The child node circuit may further support a resonant circuit that generates an oscillation frequency, to absorb a peak current in a clock circuit and reduce power consumption. Further, the child node circuit may further support generation of a plurality of oscillation frequencies of different frequencies, so as to meet a higher requirement of a die on clock frequency conversion. Therefore, the child node circuit may have both a gating function and a resonance function, and generate oscillation frequencies of different frequencies, so as to improve performance of the clock circuit.

In a possible implementation, the clock tree includes a plurality of cascaded clock buffers.

Optionally, the processor clock system may also be referred to as a clock system or a clock circuit.

Optionally, the child node circuit may be referred to as a gating, resonant, and decoupling (gating & resonant & decoupling, GRD) circuit.

With reference to the first aspect, in a possible implementation, the clock gating unit is configured to: receive the second clock signal clk_2 and the gating signal G, and output the third clock signal clk_3 to the clock grid and the resonant and decoupling unit.

The clock gating unit generates the third clock signal clk_3 based on the second clock signal clk_2 and the gating signal G, to implement a gating function and improve performance of a clock circuit.

That the gating signal G is configured by a system may mean that the gating signal G may be from a control logic circuit inside a die, or may be generated by upper-layer software by using a control logic circuit.

With reference to the first aspect, in a possible implementation, the resonant and decoupling unit includes: a plurality of resonant inductor circuits connected in parallel, a plurality of switch circuits, and one or more decoupling capacitors. The plurality of resonant inductor circuits are in a one-to-one correspondence with the plurality of switch circuits, and resonant inductors are separately disposed on the plurality of resonant inductor circuits.

The child node circuit further includes a decoupling capacitor, to implement a noise reduction function for power supply noise. Therefore, the child node circuit is a circuit that can implement an integrated design of a gating function, a resonance function, and a noise reduction function. Performance of the clock circuit can be improved by disposing the child node circuit in the clock grid.

The plurality of resonant inductor circuits are in a one-to-one correspondence with the plurality of switch circuits, so that oscillation frequencies of different frequencies are generated by turning on or turning off different switch circuits, thereby meeting a requirement of an application scenario on clock frequency conversion of a clock circuit, and improving performance of the clock circuit.

With reference to the first aspect, in a possible implementation, a first switch circuit of the plurality of switch circuits is configured to receive a switch control signal S, the switch control signal S is used to control the first switch circuit to be in an on state or an off state, and the first switch circuit is any one of the plurality of switch circuits.

With reference to the first aspect, in a possible implementation, the plurality of resonant inductor circuits correspond to a plurality of clock domains.

As a die scale is increasingly large, the die may be logically divided into a plurality of clock domains. Clock frequencies of the clock domains are different, and each clock domain includes an independent clock grid. In other words, each clock domain corresponds to one synchronization time, and components in the domain are all synchronized with the time. Synchronization times corresponding to different clock domains are independent of each other.

Specifically, the plurality of resonant inductor circuits may be in a one-to-one correspondence with the plurality of clock domains, that is, a resonance frequency generated by each resonant inductor circuit corresponds to one clock domain, so that the clock circuit can be applied to a die including a plurality of clock domains, thereby improving an application range and use efficiency of the clock circuit.

With reference to the first aspect, in a possible implementation, one end of the decoupling capacitor is configured to receive the third clock signal clk_3, and the other end of the decoupling capacitor is configured to be connected to a power supply or the ground.

With reference to the first aspect, in a possible implementation, the plurality of child node circuits are further connected to a plurality of registers by using the clock grid, and distribution locations of the plurality of child node circuits in the clock grid are determined based on loads and locations of the plurality of registers.

Upper-level driving and control of the clock grid are from the child node circuit. To save an area and improve driving efficiency, a child node circuit is usually not disposed on each node. Therefore, a layout of a child node circuit disposed in the clock grid needs to be optimized by using an appropriate algorithm. Therefore, the distribution locations of the plurality of child node circuits in the clock grid are determined based on the loads and the locations of the plurality of registers, so that driving efficiency of the clock circuit can be improved.

With reference to the first aspect, in a possible implementation, when the loads of the plurality of registers are balanced in the clock grid, the distribution locations of the plurality of child node circuits in the clock grid are determined based on a clustering algorithm or a linear regression algorithm. An input of the clustering algorithm or the linear regression algorithm includes the locations of the plurality of registers in the clock grid, and an output of the clustering algorithm or the linear regression algorithm includes the distribution locations of the plurality of child node circuits in the clock grid.

The distribution locations of the plurality of child node circuits in the clock grid are determined by using the clustering algorithm or the linear regression algorithm, so as to use as few child node circuits as possible and properly allocate locations of the child node circuits, thereby improving driving efficiency of the clock circuit.

According to a second aspect, a child node circuit in a clock system is provided. The child node circuit is disposed in a clock grid of the clock system, and the child node circuit includes a clock gating unit and a resonant and decoupling unit. The clock gating unit is configured to: receive a gating signal G and a second clock signal clk_2 from a clock tree, and output a third clock signal clk_3 to the clock grid and the resonant and decoupling unit. The resonant and decoupling unit includes a decoupling capacitor and a plurality of resonant inductors. The resonant and decoupling unit supports generation of a plurality of oscillation frequencies of different frequencies, and is configured to receive the third clock signal clk_3.

The child node circuit receives and processes the second clock signal clk_2 that is output by the clock tree, and outputs the third clock signal clk_3, to implement a gating function. The child node circuit may further support a resonant circuit that generates an oscillation frequency, to absorb a peak current in a clock circuit and reduce power consumption. Further, the child node circuit may further support generation of a plurality of oscillation frequencies of different frequencies. Therefore, the child node circuit may have both a gating function and a resonance function, and generate oscillation frequencies of different frequencies, so as to improve performance of the clock circuit.

With reference to the second aspect, in a possible implementation, the clock gating unit is configured to: receive the second clock signal clk_2 and the gating signal G, and output the third clock signal clk_3 to the clock grid and the resonant and decoupling unit.

With reference to the second aspect, in a possible implementation, the resonant and decoupling unit includes: a plurality of resonant inductor circuits connected in parallel, a plurality of switch circuits, and one or more decoupling capacitors. The plurality of resonant inductor circuits are in a one-to-one correspondence with the plurality of switch circuits, and resonant inductors are separately disposed on the plurality of resonant inductor circuits.

With reference to the second aspect, in a possible implementation, a first switch circuit of the plurality of switch circuits is further configured to receive a switch control signal S, the switch control signal S is used to control the first switch circuit to be in an on state or an off state, and the first switch circuit is any one of the plurality of switch circuits.

With reference to the second aspect, in a possible implementation, the plurality of resonant inductor circuits are in a one-to-one correspondence with a plurality of clock domains.

With reference to the second aspect, in a possible implementation, one end of the decoupling capacitor is configured to receive the third clock signal clk_3, and the other end of the decoupling capacitor is configured to be connected to a power supply or the ground.

According to a third aspect, an electronic device is provided, including: a first die, where a plurality of micro solder balls are disposed on a lower surface of the first die, and the first die is electrically connected to a second die by using the plurality of micro solder balls; the second die, disposed below the first die, where a plurality of through silicon vias penetrating the second die are disposed on the second die, a plurality of solder balls are disposed on a lower surface of the second die, and the plurality of through silicon vias are connected to the plurality of solder balls; and a substrate, disposed below the second die, where the second die is electrically connected to the substrate by using the plurality of through silicon vias and the plurality of solder balls. A clock circuit is disposed on the electronic device, and the clock circuit includes: a phase lock loop PLL, configured to output a first clock signal clk_1; a clock tree, configured to: receive the first clock signal clk_1, and output a second clock signal clk_2; and a clock grid, where the clock grid is connected to a plurality of registers, and the clock grid is configured to: receive the second clock signal clk_2, and output a third clock signal clk_3 to the plurality of registers. The PLL and the clock tree are disposed on the first die, and the clock grid is disposed on the second die.

An architecture of a three-dimensional clock circuit may be disposed on an electronic device including a plurality of dies that are packaged in a stacked manner. To be specific, the clock circuit may be distributed in two or more dies, a PLL and a clock tree are disposed on a first die, and a clock grid is disposed on a second die, so that a clock signal can drive a circuit in the die more flexibly and quickly, thereby improving clock performance.

With reference to the third aspect, the clock grid includes a plurality of nodes, and some of the plurality of nodes each are provided with the child node circuit in any one of the second aspect or the possible implementations of the second aspect.

With reference to the third aspect, in a possible implementation, the clock tree includes a plurality of levels of clock buffers, and a last level of clock buffer in the plurality of levels of clock buffers is connected to a plurality of child node circuits in the clock grid by using the plurality of micro solder balls.

According to a fourth aspect, an electronic device is provided, including: a first die; a second die, disposed below the first die and electrically connected to the first die, where a plurality of first through silicon vias are disposed on the second die, a plurality of micro solder balls are disposed on a lower surface of the second die, and the second die is electrically connected to a third die by using the plurality of first through silicon vias and the plurality of micro solder balls; the third die, disposed below the second die, where a plurality of second through silicon vias penetrating the third die are disposed on the third die, a plurality of solder balls are disposed on a lower surface of the third die, and the plurality of second through silicon vias are connected to the plurality of solder balls; and a substrate, disposed below the third die, where the third die is electrically connected to the substrate by using the plurality of second through silicon vias and the plurality of solder balls. A clock circuit is disposed on the electronic device, and the clock circuit includes: a phase lock loop PLL, configured to output a first clock signal clk_1; a clock tree, configured to: receive the first clock signal clk_1, and output a second clock signal clk_2; and a clock grid, where the clock grid is connected to a plurality of registers, and the clock grid is configured to: receive the second clock signal clk_2, and output a third clock signal clk_3 to the plurality of registers. The PLL and a part of the clock tree are disposed on the first die, the other part of the clock tree is disposed on the second die, and the clock grid is disposed on the third die.

An architecture of a three-dimensional clock circuit may be disposed on an electronic device including a plurality of dies that are packaged in a stacked manner. To be specific, the clock circuit may be distributed in two or more dies, a PLL and a part of a clock tree are disposed on a first die and the other part of the clock tree is disposed on a second die, and a clock grid is disposed on a third die, so that a clock signal can drive a circuit in the die more flexibly and quickly, thereby improving clock performance.

With reference to the fourth aspect, in a possible implementation, the clock grid includes a plurality of nodes, and some of the plurality of nodes each are provided with the child node circuit in any one of the second aspect or the possible implementations of the second aspect.

With reference to the fourth aspect, in a possible implementation, the clock tree includes a plurality of levels of clock buffers, and a last level of clock buffer in the plurality of levels of clock buffers is connected to a plurality of child node circuits in the clock grid by using the plurality of first through silicon vias and the plurality of micro solder balls.

According to a fifth aspect, a chip system is provided. The clock circuit in any one of the first aspect or the possible implementations of the first aspect is disposed on the chip system, or a child node circuit used for a clock circuit in any one of the second aspect or the possible implementations of the second aspect is disposed on the chip system.

DESCRIPTION OF EMBODIMENTS

The following describes technical solutions in this application with reference to the accompanying drawings.

For ease of understanding, several terms used in the solutions of this application are first described.

Clock skew (clock skew): The clock skew is a time offset generated when one clock source reaches clock ends of two different registers. A calculation formula of the clock skew may be expressed as:

$$T_{skew} = T_{clk2} - T_{clk1} \quad (1).$$

Herein, $T_{skew}$ represents the clock skew, and $T_{clk2}$ and $T_{clk1}$ respectively represent moments at which the clock source reaches the two different register clocks.

Clock jitter (clock jitter): The clock jitter is an offset of an actual clock relative to an ideal clock, is not accumulated with time, and is sometimes advanced or delayed.

Differential circuit: An input end of the differential circuit is configured to receive two input signals, and a difference between the two input signals is a valid input signal of the differential circuit. An output of the differential circuit is amplification of the difference between the two input signals. If an interference signal exists in the differential circuit, same interference is generated on two input signals. Through a difference between the two signals, a valid input of the interference signal is zero, so as to resist common-mode interference.

Phase lock loop (phase lock loop, PLL): The phase lock loop is configured to integrate all clock signals, so that a high-frequency device works normally. The PLL is generally an analog circuit placed inside a die. A clock signal at an input end of the PLL is from a clock generation circuit outside the die, and is generally a crystal oscillator. A clock signal at an output end of the PLL is a clock source (clock source) signal of a clock network. The output clock source of the PLL is propagated to a clock pin of each sequential circuit (represented as a register in the figure) inside the die through a clock tree, to serve as an input of each component of the die.

Clock network (clock network): The clock network is a topology structure of a clock circuit inside a die, and is usually implemented by using a structure of a clock tree (clock tree) or a clock grid (clock grid).

Time grid: The time grid is a method for implementing a clock network by using a structure of a two-dimensional mesh (2D mesh).

Figure 1:
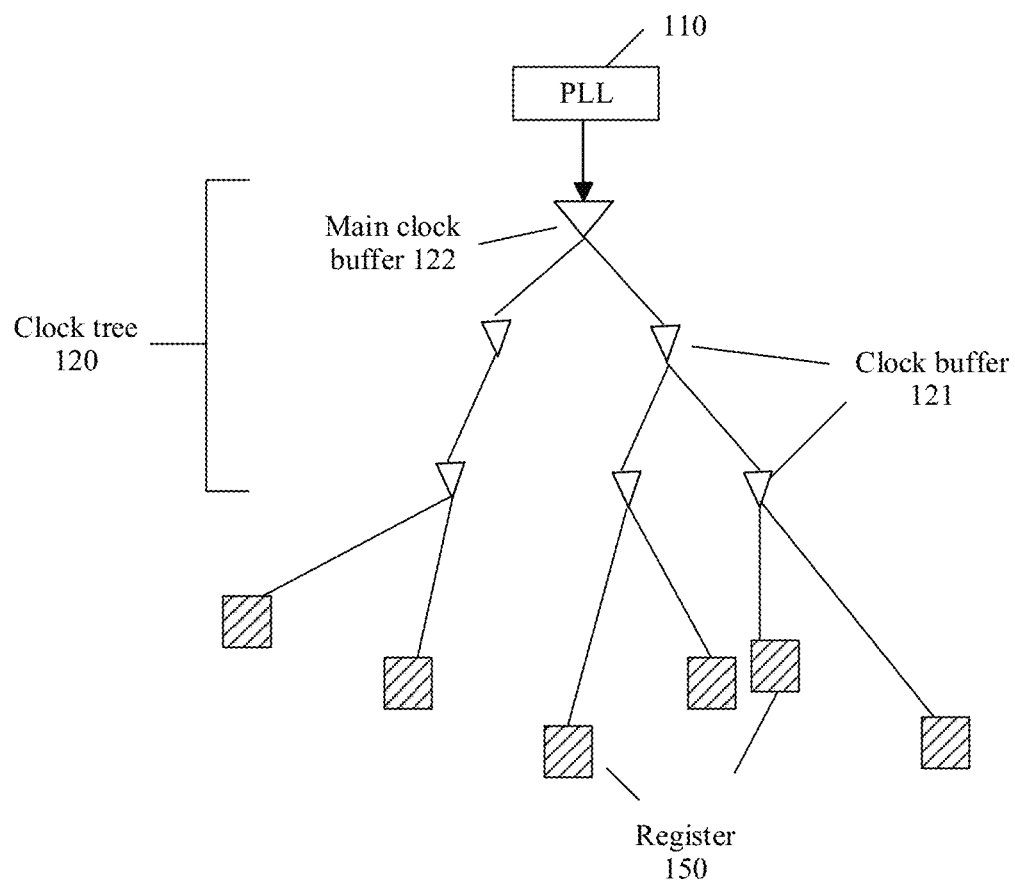
FIG. 1 is a schematic diagram of a clock circuit according to an embodiment of this application.

For ease of understanding, the following describes a basic principle of a clock circuit. FIG. 1 is a schematic diagram of a clock circuit 100 according to an embodiment of this application.

As shown in FIG. 1, the clock circuit 100 includes a PLL 110 and a clock tree 120. The PLL 110 is configured to output a clock signal. The clock tree 120 is configured to amplify the clock signal to drive a post-stage circuit, for example, drive a register 150 in the post-stage circuit.

As shown in FIG. 1, the clock tree 120 generally includes a plurality of levels of clock buffers 121. Each level of clock buffer includes one or more clock buffers 121. A clock buffer 121 connected to the PLL 110 may be referred to as a main clock buffer 122. The last level of clock buffer 121 may be configured to connect to the register 150.

In a conventional clock tree design, when a die scale is increasingly large, a quantity of levels of clock buffers also increases. As a quantity of levels increases, a driving capability of a clock buffer weakens, a delay of the clock buffer increases, and power consumption of the clock buffer increases, and therefore a degree of a clock skew and a degree of a clock jitter of a register in a post-stage circuit also double. For example, in a typical processor design, a clock skew averages tens of ps (picoseconds).

Figure 2:
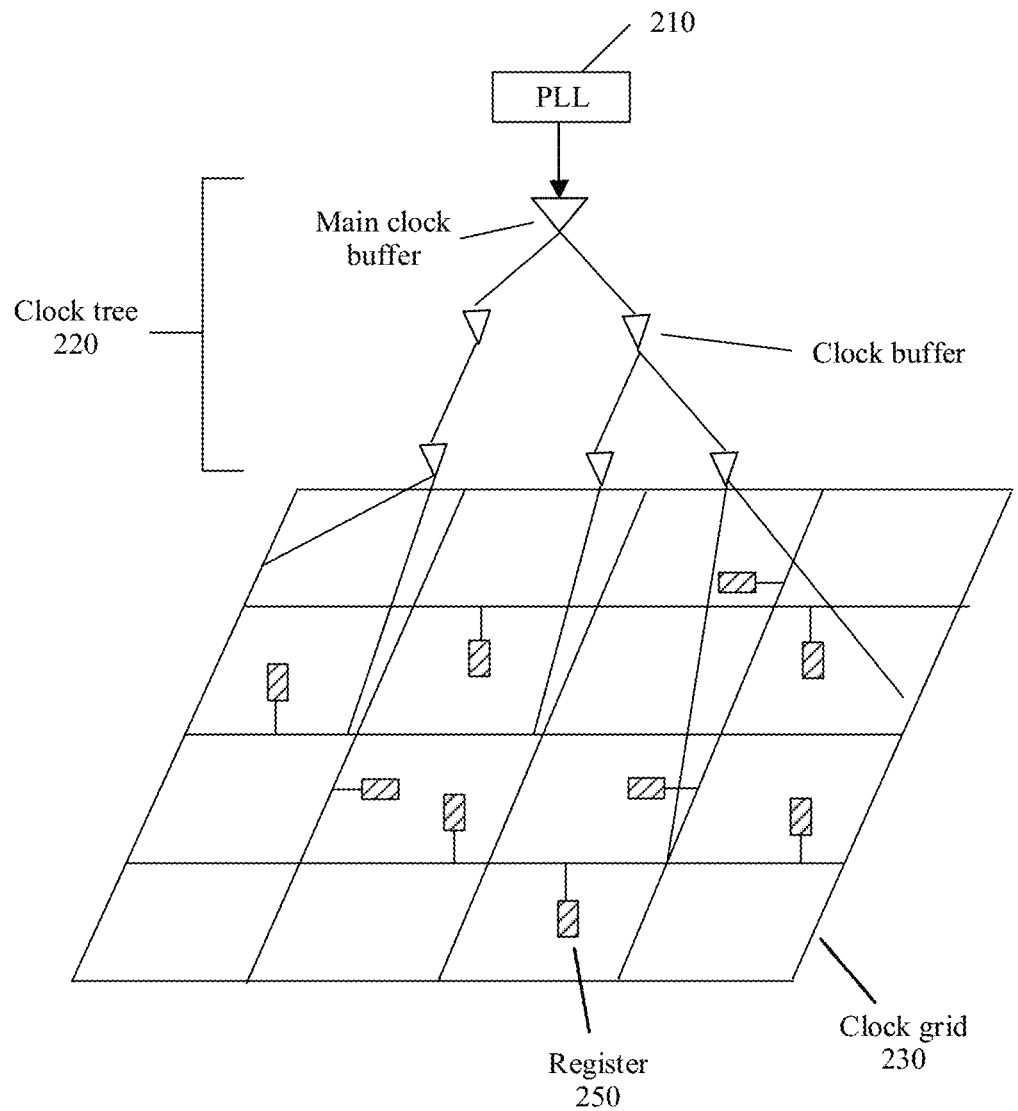
FIG. 2 is a schematic diagram of a clock circuit according to another embodiment of this application.

FIG. 2 is a schematic diagram of a structure of a clock circuit 200 according to another embodiment of this application. FIG. 2 shows a clock circuit improved based on FIG. 1. The clock circuit 200 provides a clock grid 230 between a clock tree 220 and a register 250. The clock grid 230 is a common type of a clock network, and may be a topology of a grid clock network. The clock grid 230 is formed by a connection between a clock tree and a sequential circuit (represented as the register 250 in the figure) inside a die, and each sequential circuit inside the die needs to be driven by a clock signal to implement data update. The clock network is configured to transmit a clock signal to each sequential component.

Compared with the design solution of the clock circuit in FIG. 1, this grid clock design can implement a smaller clock skew and a smaller clock jitter, to improve clock frequency.

However, the clock topology structure in FIG. 2 is a global grid clock, but the global grid clock also has some disadvantages. For example, global gridding has a high requirement on metal cabling of the die. Metal line specifications (for example, a width, an area, or a through via) and a quantity of layers need to be customized, lacking universality. A resistance-capacitance (resistance-capacitance, RC) parameter of a grid circuit is large, and power consumption is high. Global gridding has a high requirement on driving of a clock buffer, requires a large quantity of clock buffers, and occupies a large area.

To resolve the foregoing problem, an improved solution is to introduce a resonant inductor into a clock network. An advantage of this method is that power consumption is reduced. The clock network into which the resonant inductor is introduced may be referred to as a resonant clock network. The resonant clock network uses an on-die inductor to create an "electric pendulum" (electric pendulum), so as to form a resonant circuit (or may also be referred to as an "oscillation loop"). The resonant circuit may generate an oscillation frequency, to reuse power consumption in a clock circuit instead of wasting power consumption in each clock cycle. Therefore, there is no need to use a large quantity of clock buffers in the clock circuit.

The resonant circuit is a clock generation source. Therefore, there is no need to use a large quantity of clock buffers like in a conventional clock circuit. The resonant circuit needs to excite energy exchange at an initial stage, and when a loss of the resonant circuit causes the energy exchange to slow down, the resonant circuit needs to perform excitation again. However, power required by these excitations is also far less than driving power of a clock buffer of an existing clock network.

However, a problem of this solution is that an inductor in the clock circuit is fixed, and therefore an oscillation frequency remains unchanged. This solution cannot meet a requirement of a clock with a wide frequency, and cannot be applied to a processor having a high requirement on frequency conversion, for example, a turbo (turbo) mode or a fast frequency scaling down mode. In addition, power consumption cannot be further reduced by using only the conventional inductor design.

To resolve the foregoing problem, an embodiment of this application provides a clock circuit. A child node circuit is disposed on the clock circuit, and the child node circuit can simultaneously implement a resonance function, a decoupling function, and a clock control function. In addition, oscillation frequencies of different frequencies may be generated, so that the clock circuit is applicable to a processor having a high requirement on frequency conversion, and performance of the clock circuit is improved.

Figure 3:
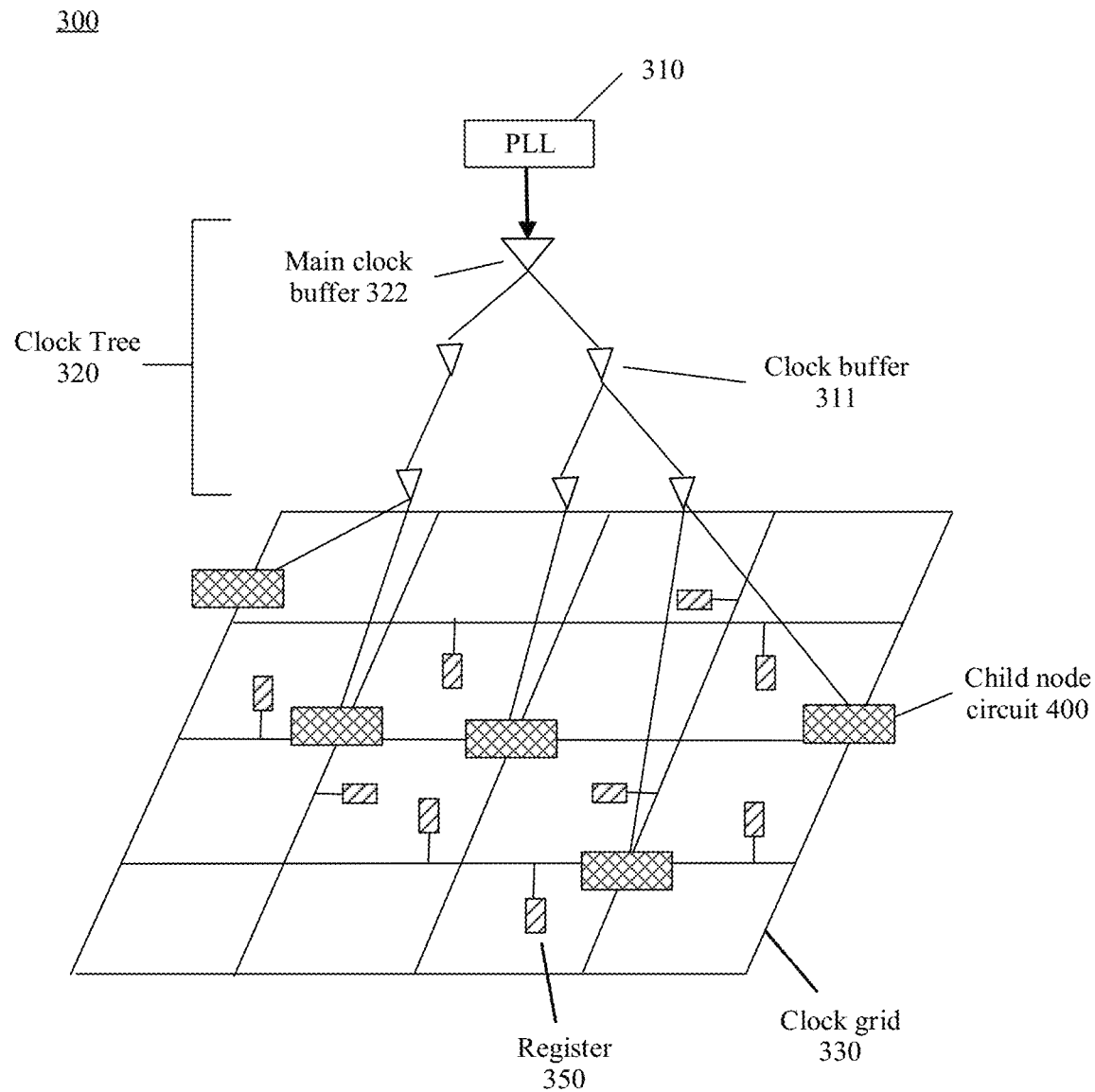
FIG. 3 is a schematic diagram of a clock circuit according to an embodiment of this application.

FIG. 3 is a schematic diagram of a clock circuit 300 according to an embodiment of this application. As shown in FIG. 3, the clock circuit 300 includes a PLL 310, a clock tree 320, and a clock grid 330. A plurality of child node circuits 400 are disposed in the clock grid 330. In embodiments of this application, the child node circuit 400 may be referred to as a gating, resonant, and decoupling (gating & resonant & decoupling, GRD) circuit.

The PLL 310 is configured to output a first clock signal clk_1 to the clock tree 320.

The clock tree 320 is connected to the PLL 310, and is configured to: receive the first clock signal clk_1, and output a second clock signal clk_2. The clock tree 320 includes a plurality of levels of clock buffers 321, and each level of clock buffer 321 includes one or more clock buffers 321. Generally, a larger quantity of levels indicates a larger quantity of clock buffers 321. A clock buffer 321 connected to the PLL 310 may be referred to as a main clock buffer 322. The clock buffer 321 in the clock tree 320 may be understood as a node in the clock tree 320. A function of the clock buffer 321 is similar to that of a clock repeater, and the clock buffer 321 is configured to drive a larger load.

The clock grid 330 includes a plurality of nodes, some of the plurality of nodes each are provided with a child node circuit 400, the plurality of child node circuits 400 are connected to the clock tree 320, and the plurality of child node circuits 400 are further connected to a plurality of registers 350 by using the clock grid 330.

During actual physical implementation, the clock grid 330 is usually connected by using metal lines at different layers and vias (via) at an upper layer and a lower layer.

The plurality of child node circuits 400 are configured to: receive the second clock signal clk_2, and output a third clock signal clk_3 to the clock grid 330, to implement a gating function of the clock circuit. That the plurality of child node circuits 400 output the third clock signal clk_3 to the clock grid 330 may be understood as that the plurality of child node circuits 400 are configured to drive and control the plurality of registers 350 in the clock grid 330.

The child node circuit 400 may further support a resonant circuit that generates an oscillation frequency, to absorb a peak current in a clock circuit and reduce power consumption. In addition, the child node circuit 400 may support generation of a plurality of oscillation frequencies of different frequencies, so as to meet a higher requirement of a die on clock frequency conversion. The child node circuit 400 further includes a decoupling capacitor Cd, to implement a noise reduction function for power supply noise. Therefore, the child node circuit 400 is a circuit that can implement an integrated design of a gating function, a resonance function, and a noise reduction function. Performance of the clock circuit can be improved by disposing the child node circuit 400 in the clock grid 330. The following continues to describe a circuit structure and an operating principle of the child node circuit 400 with reference to FIG. 4.

It should be noted that, in embodiments of this application, the gating function may be a function of turning off or turning on a local circuit in the clock circuit by using a gating signal. The local circuit may be a circuit part corresponding to the child node circuit 400, and may be divided and arranged according to practice. The noise reduction function may also be referred to as a noise suppression function, and is used to perform noise reduction on power supply noise in the clock circuit. The resonance function may be absorbing a peak current in the clock circuit by using a resonant circuit, to reduce power consumption.

Figure 4:
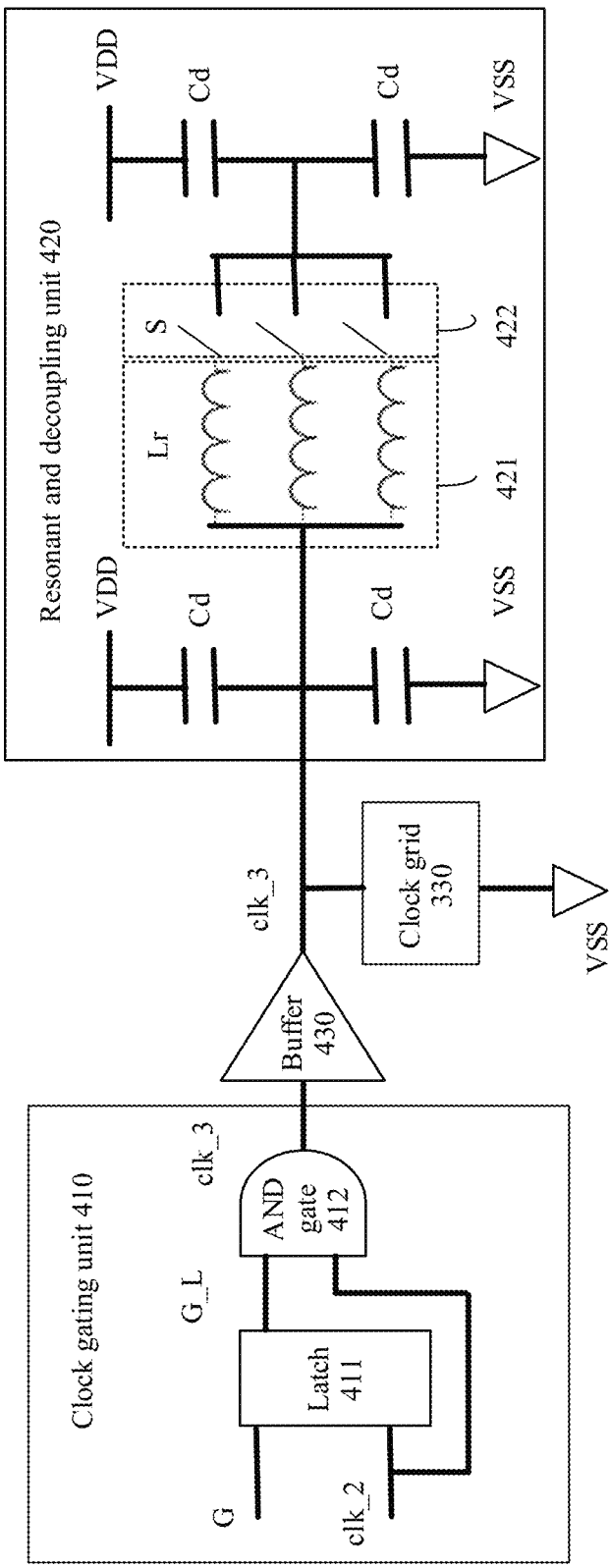
FIG. 4 is a schematic diagram of a principle of a child node circuit 400 according to an embodiment of this application.

FIG. 4 is a schematic diagram of a principle of a child node circuit 400 according to an embodiment of this application. As shown in FIG. 4, the child node circuit 400 includes a clock gating unit 410 and a resonant and decoupling unit 420.

The clock gating unit 410 receives a second clock signal clk_2 that is output by the clock tree 320 and a gating signal G, and outputs a third clock signal clk_3 based on the second clock signal clk_2 and the gating signal G, to implement a gating function. Optionally, the gating signal G may be configured by a system.

That the gating signal G is configured by a system may mean that the gating signal G may be from a control logic circuit inside a die, or may be generated by upper-layer software by using a control logic circuit. It should be understood that another signal configured by the system in embodiments of this application may also be explained by using the foregoing definition.

The clock gating unit 410 is further configured to output the third clock signal clk_3 to a resonant and decoupling unit 420, so that the resonant and decoupling unit 420 implements a resonance function and a noise suppression function for the third clock signal clk_3.

Still as shown in FIG. 4, in a specific example, the clock gating unit 410 includes a latch 411 and an AND gate 412. The latch 411 is configured to: receive the gating signal G and the second clock signal clk_2 received from the clock tree, and output a control signal G_L. The AND gate 412 is configured to: receive the second clock signal clk_2 and the control signal G_L, and output the third clock signal clk_3. The third clock signal clk_3 is used to drive the clock grid 330.

It should be understood that the specific structure of the clock gating unit 410 in FIG. 4 is merely an example. The clock gating unit 410 may alternatively be implemented by using another type of gating device and another connection manner, provided that the clock gating unit 410 can implement a gating function of the clock circuit. This is not limited in embodiments of this application.

The resonant and decoupling unit 420 supports generation of a plurality of oscillation frequencies of different frequencies, to implement a resonance function. The resonant and decoupling unit 420 further includes a decoupling capacitor Cd, to implement a noise reduction function for power supply noise.

Still as shown in FIG. 4, the resonant and decoupling unit 420 includes: a plurality of resonant inductor circuits 421 connected in parallel, a plurality of switch circuits 422, and one or more decoupling capacitors Cd. The plurality of resonant inductor circuits 421 are in a one-to-one correspondence with the plurality of switch circuits 422. A plurality of resonant inductors Lr are disposed on the plurality of resonant inductor circuits 421 respectively. In some examples, inductance values of any two of the plurality of resonant inductors are different.

In some examples, a buffer 430 may be disposed on the clock gating unit 410 and the resonant and decoupling unit 420, to increase a driving capability of a signal.

Optionally, the resonant and decoupling unit 420 is further configured to receive a plurality of switch control signals S. The plurality of switch control signals S are in a one-to-one correspondence with the plurality of switch circuits 422. The switch control signal S is used to control a corresponding switch circuit 422 to be in an on state or an off state. The switch control signal S may be configured by the system.

For example, a first switch circuit 422 of the plurality of switch circuits 422 is configured to receive a switch control signal S, the switch control signal S is used to control the first switch circuit 422 to be in an on state or an off state, and the first switch circuit 422 is any one of the plurality of switch circuits 422.

When one of the plurality of switch circuits 422 is turned on, a resonant inductor circuit 421 corresponding to the switch circuit 422 may be connected to a resonant circuit, and generate a corresponding oscillation frequency. The resonant circuit is a circuit that generates an oscillation frequency based on the resonant inductor Lr and the decoupling capacitor Cd. Different combinations of the resonant inductor Lr and the decoupling capacitor Cd may generate different oscillation frequencies. In other words, different resonant inductor circuits 421 correspond to different oscillation frequencies.

In some examples, the switch control signal S may be used to control the first switch circuit 422 to be turned on, so that a resonant inductor circuit 421 corresponding to the first switch circuit 422 is connected to the resonant circuit, to generate an oscillation frequency. The first switch circuit 422 is any one of the plurality of switch circuits 422.

In some examples, in a same time period, only one of the plurality of switch circuits 422 is in an on state. That is, in a same time period, only one of the plurality of resonant inductor circuits 421 is allowed to participate in the resonant circuit. In some other examples, in a same time period, one or more of the plurality of switch circuits 422 may be in an on state. That is, in a same time period, one or more of the plurality of resonant inductor circuits 421 are allowed to participate in the resonant circuit.

Optionally, one end of each of the one or more decoupling capacitors Cd is configured to receive the third clock signal clk_3, and the other end of the decoupling capacitor Cd is configured to be connected to a power supply or the ground.

It should be noted that, in embodiments of this application, the resonant inductor Lr may also be referred to as an inductor Lr, and the decoupling capacitor Cd may also be referred to as a capacitor Cd.

Optionally, as a die scale is increasingly large, the die may be logically divided into a plurality of clock domains. Clock frequencies of the clock domains are different, and each clock domain includes an independent clock grid. In other words, each clock domain corresponds to one synchronization time, and components in the domain are all synchronized with the time. Synchronization times corresponding to different clock domains are independent of each other.

In some examples, the plurality of resonant inductor circuits are in a one-to-one correspondence with a plurality of clock domains. For example, the plurality of resonant inductors Lr may be connected in parallel by using independent switches, and a quantity of inductors connected in parallel may depend on a quantity of clock domains (clock domain). Different combinations of the resonant inductor Lr and the decoupling capacitor Cd may generate different oscillation frequencies.

Optionally, the oscillation frequency of the resonant circuit may be calculated according to the following formula (2):

$$f = \frac{1}{2\pi\sqrt{LC}} \qquad (2).$$

Herein, f represents an oscillation frequency, L represents an inductance value, and C represents a capacitance value.

As shown in FIG. 4, one end of the resonant inductor Lr is configured to receive the third clock signal clk_3. The other end of the resonant inductor Lr may be connected to a power supply or the ground by using the decoupling capacitor Cd.

It should be noted that the structure of the child node circuit 400 in FIG. 4 is merely used as an example. In practice, the child node circuit 400 may include more components or use another connection manner. Alternatively, the child node circuit 400 may include fewer modules and components than those in FIG. 4. A specific structure of the child node circuit 400 is not limited in embodiments of this application, provided that the functions described above can be implemented.

In embodiments of this application, the child node circuit 400 may absorb a peak current by using the plurality of resonant inductor circuits 421, thereby reducing power consumption. In addition, the child node circuit 400 may further use a combination of the plurality of resonant inductor circuits 421 and the decoupling capacitor Cd, that is, a plurality of combinations of the inductor and the capacitor for resonance, to generate oscillation frequencies of different frequencies, thereby meeting a requirement of the processor on clock frequency conversion.

In embodiments of this application, when the resonant inductor circuit 421 is turned off, the decoupling capacitor Cd may be used as a universal decoupling capacitor of a die power supply, and is configured to suppress transient noise (or synchronous switching noise SSN).

Optionally, in a specific example, based on requirements of the power supply and the ground on a transient voltage, a capacitor capacity may be increased in a manner in which a plurality of decoupling capacitors Cd are connected in parallel, to achieve a better effect.

In embodiments of this application, when a hybrid design of a clock tree and a clock grid is used in the clock circuit, a parasitic parameter and a load of the clock network are relatively large, and consequently power consumption is higher. When the clock gating unit 410 is not disposed, the clock circuit is flipped in each clock cycle. When the clock gating unit 410 is disposed, the clock circuit is controlled by the gating signal G, so that a quantity of flip times of the clock circuit is reduced, or clock switching behavior is reduced, thereby reducing power consumption. Therefore, by adding the clock gating unit 410 to the child node circuit 400, clock switching behavior can be reduced, and switching power consumption can be reduced. In addition, because switching behavior of a clock pin is reduced, internal power consumption of the register is also reduced.

In an example, 20% to 50% power consumption can be usually reduced by using the clock gating unit 410. A principle of reducing power consumption of the clock gating unit 410 is reducing dynamic power consumption of the clock circuit by controlling a clock flip rate (expressed as a). For example, a formula (3) shows a manner of calculating power consumption of the clock circuit.

$$P = a \times f \times C \times V^2 \qquad (3).$$

Herein, P represents power consumption of the clock circuit, a represents a clock flip rate, C represents a load equivalent capacitance, and V represents a working voltage of the clock circuit.

Figure 5:
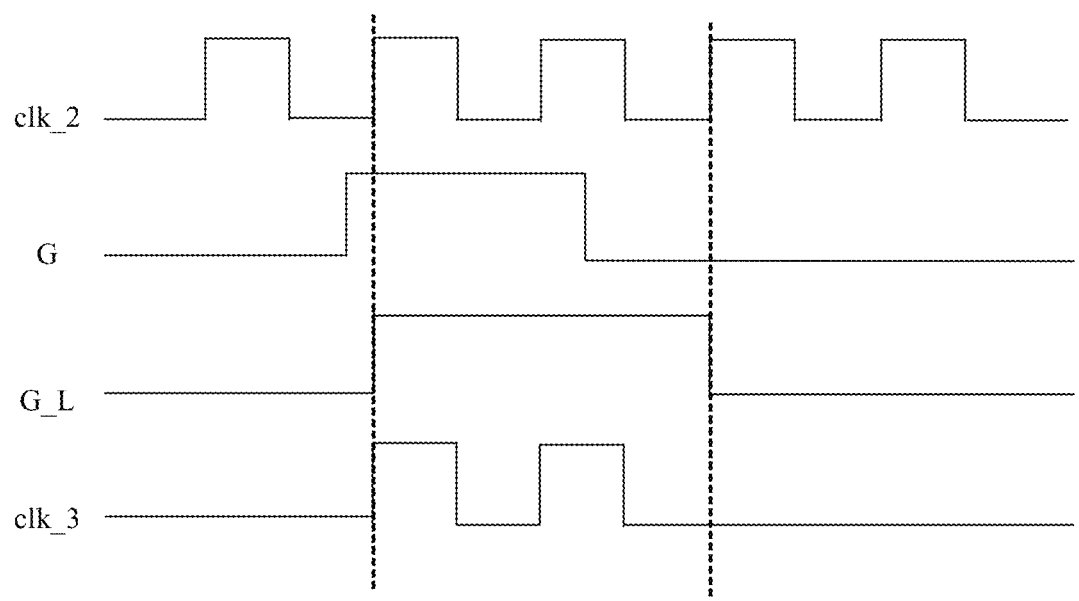
FIG. 5 is a schematic diagram of a time sequence of a clock gating control signal according to an embodiment of this application.

FIG. 5 is a schematic diagram of a time sequence of a clock gating control signal of the child node circuit 400 according to an embodiment of this application. As shown in FIG. 5, the second clock signal clk_2 represents a clock signal that is output by the clock tree 320. The gating signal G is a signal of an open interface, and the open interface means that the signal may be controlled by upper-layer software. The control signal G_L represents a signal obtained after the gating signal G is synchronized with the second clock signal clk_2 by using the latch 411. The third clock signal clk_3 represents a signal obtained after an AND operation is performed on the control signal G_L and the second clock signal clk_2. The third clock signal clk_3 is an output signal of the clock gating unit 410.

The following continues to describe a clock grid layout algorithm of the child node circuit 400 in embodiments of this application. Upper-level driving and control of the clock grid are from the child node circuit 400. To save an area and improve driving efficiency, a child node circuit 400 is usually not disposed on each node. Therefore, a layout of a child node circuit 400 disposed in the clock grid needs to be optimized by using an appropriate algorithm.

In a possible implementation, when loads of register circuits are load balancing (uniform) in the clock grid, a clock grid layout of the child node circuit 400 may be implemented by using a clustering algorithm or a linear regression algorithm.

Figure 6:
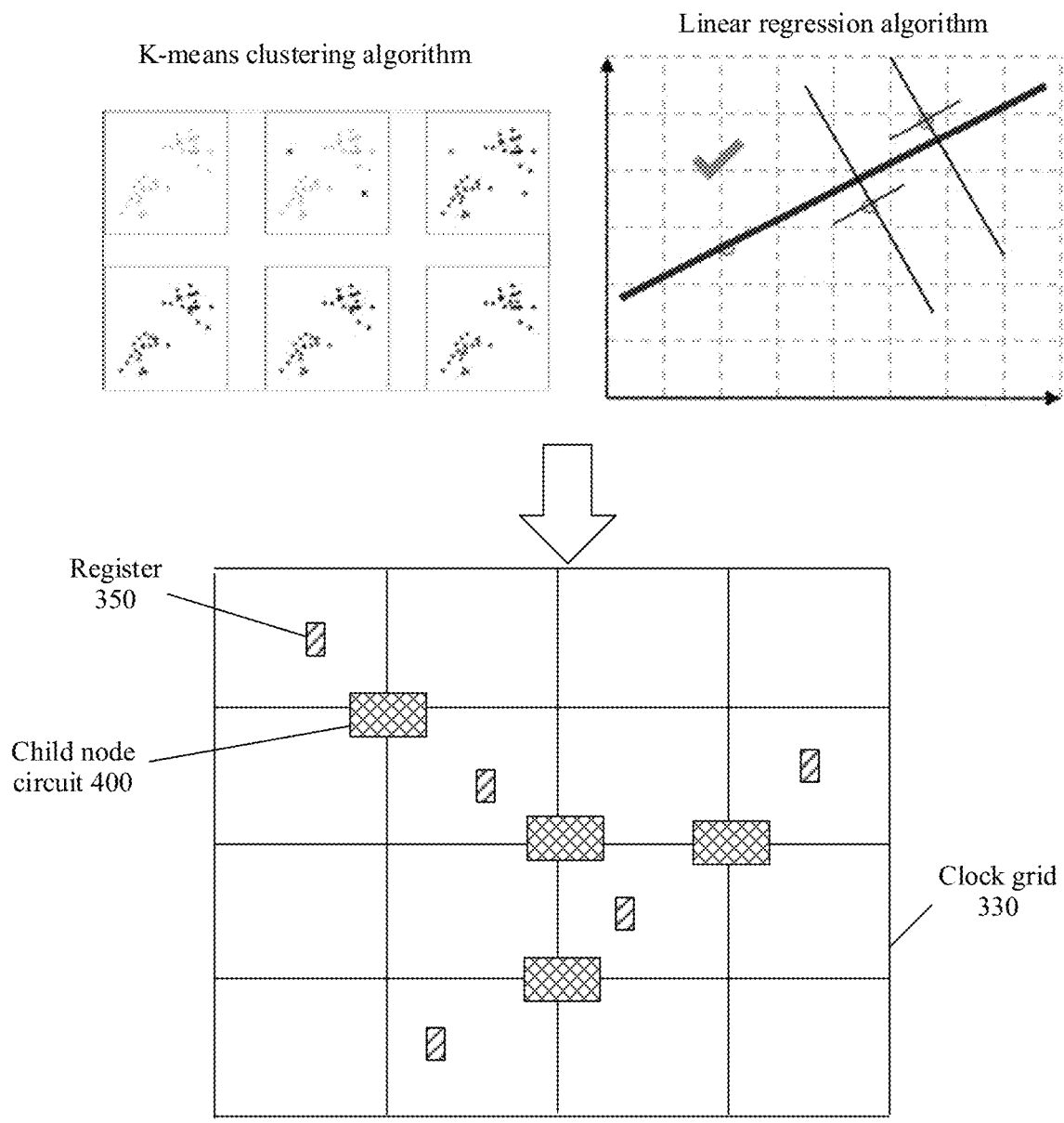
FIG. 6 is a schematic diagram of a layout of a child node circuit 400 in a load balancing case according to an embodiment of this application.

For example, FIG. 6 is a schematic diagram of a layout of a child node circuit 400 in a load balancing case according to an embodiment of this application. Load balancing is usually reflected by registers of a same type in a same die, or registers having a same or similar gate load (gate loading) in a clock grid.

As shown in FIG. 6, a K-means clustering algorithm (K-means clustering algorithm, K-means) or a linear regression algorithm may be used. In this case, when a quantity of registers in the clock grid is fixed, a minimum quantity of child node circuits 400 are used to drive the foregoing registers, and a total distance from the child node circuits 400 to the registers is shortest. The distance may be a planar distance, or may be a three-dimensional distance.

The K-means algorithm is a cluster analysis algorithm for iterative solving. For a given sample set, K initial centroids (initial centroids) can be specified as a cluster (cluster) type, and repeated iteration is performed until the algorithm converges.

In FIG. 6, an example in which the clustering algorithm is a K-means algorithm is used for description. It should be understood that another clustering algorithm may alternatively be used in FIG. 6 to implement a layout of the child node circuit 400 in a load balancing case.

In a possible implementation, when loads of register circuits are not balanced (non-uniform) in a clock grid, the register circuit may be first decomposed by using a grid averaging method, and then a clustering algorithm or a linear regression algorithm is used.

Figure 7:
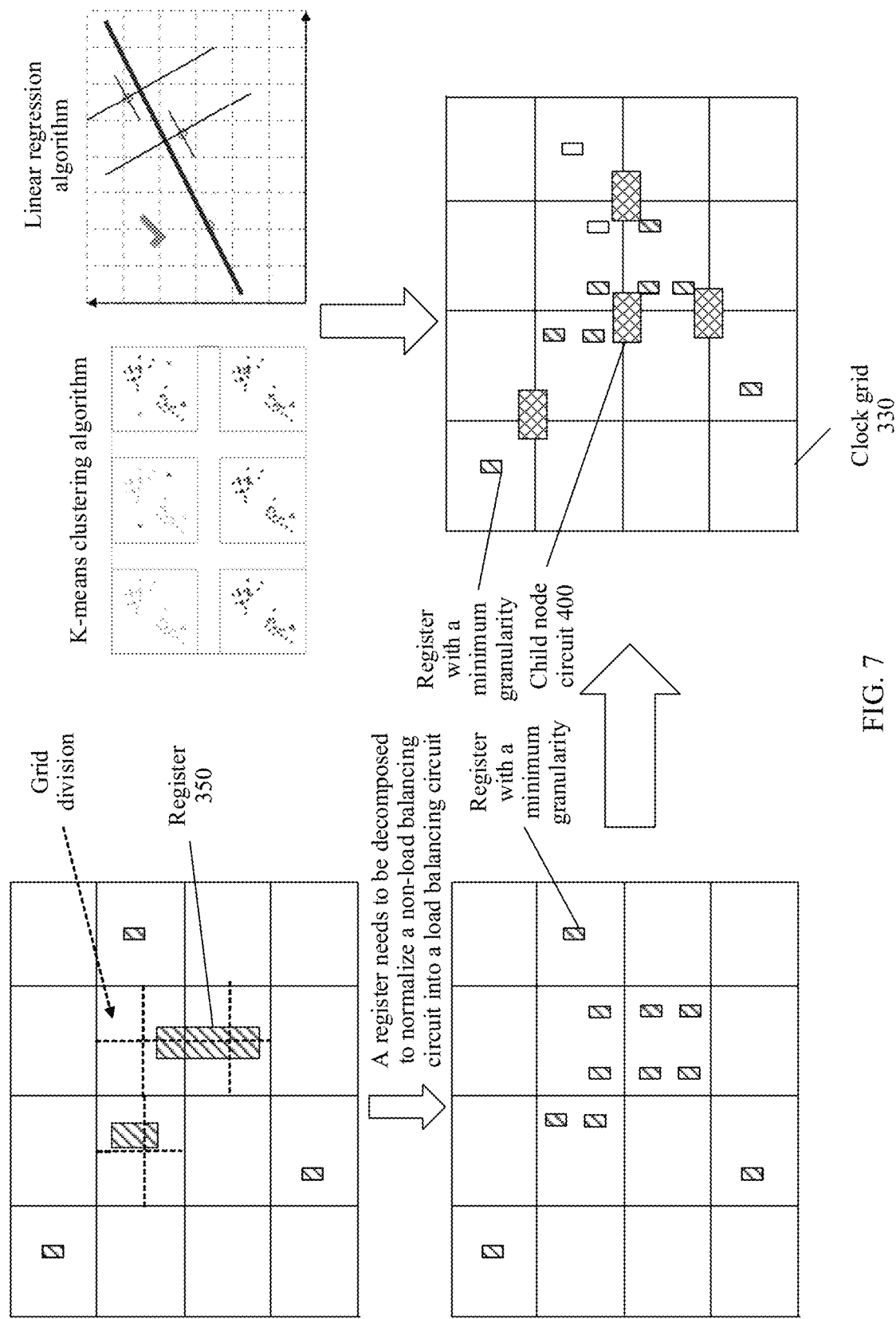
FIG. 7 is a schematic diagram of a layout of a child node circuit 400 in a non-load balancing case according to an embodiment of this application.

For example, FIG. 7 is a schematic diagram of a layout of a child node circuit 400 in a non-load balancing case according to an embodiment of this application. As shown in FIG. 7, when a register circuit in a clock grid is in a non-load balancing case, a register or a register file (register file) with more customized functions usually occurs. In this case, the clock grid may be divided into a plurality of sub-grids, and an even division method is first used in the sub-grid to decompose a large register into registers with a minimum granularity, so as to normalize a non-load balancing circuit into a load balancing circuit. Then, the layout of the child node circuit 400 is solved by using a clustering algorithm (for example, a K-means algorithm) or a linear regression algorithm.

The register with the minimum granularity may be a register with a minimum size, and the minimum size is a minimum unit of a register that can be processed by a semiconductor factory.

Optionally, a larger size of the register indicates a larger load. The register with the minimum granularity may be a register with a minimum size.

Figure 8:
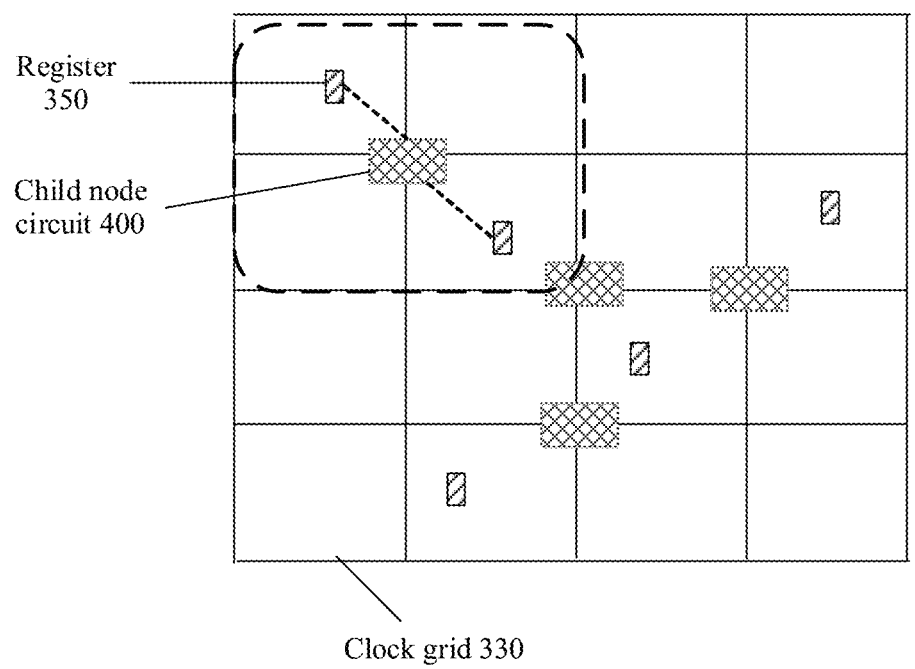
FIG. 8 is a schematic diagram of a layout of a child node circuit 400 according to an embodiment of this application.

FIG. 8 is a schematic diagram of a layout of a child node circuit 400 according to an embodiment of this application. As shown in FIG. 8, after the child node circuit 400 is arranged, a relative relationship between the child node circuit 400 and a register is that distances from a vertex (the child node circuit 400) in the figure to central locations in four surrounding sub-grids (including registers) are equal.

Figure 9:
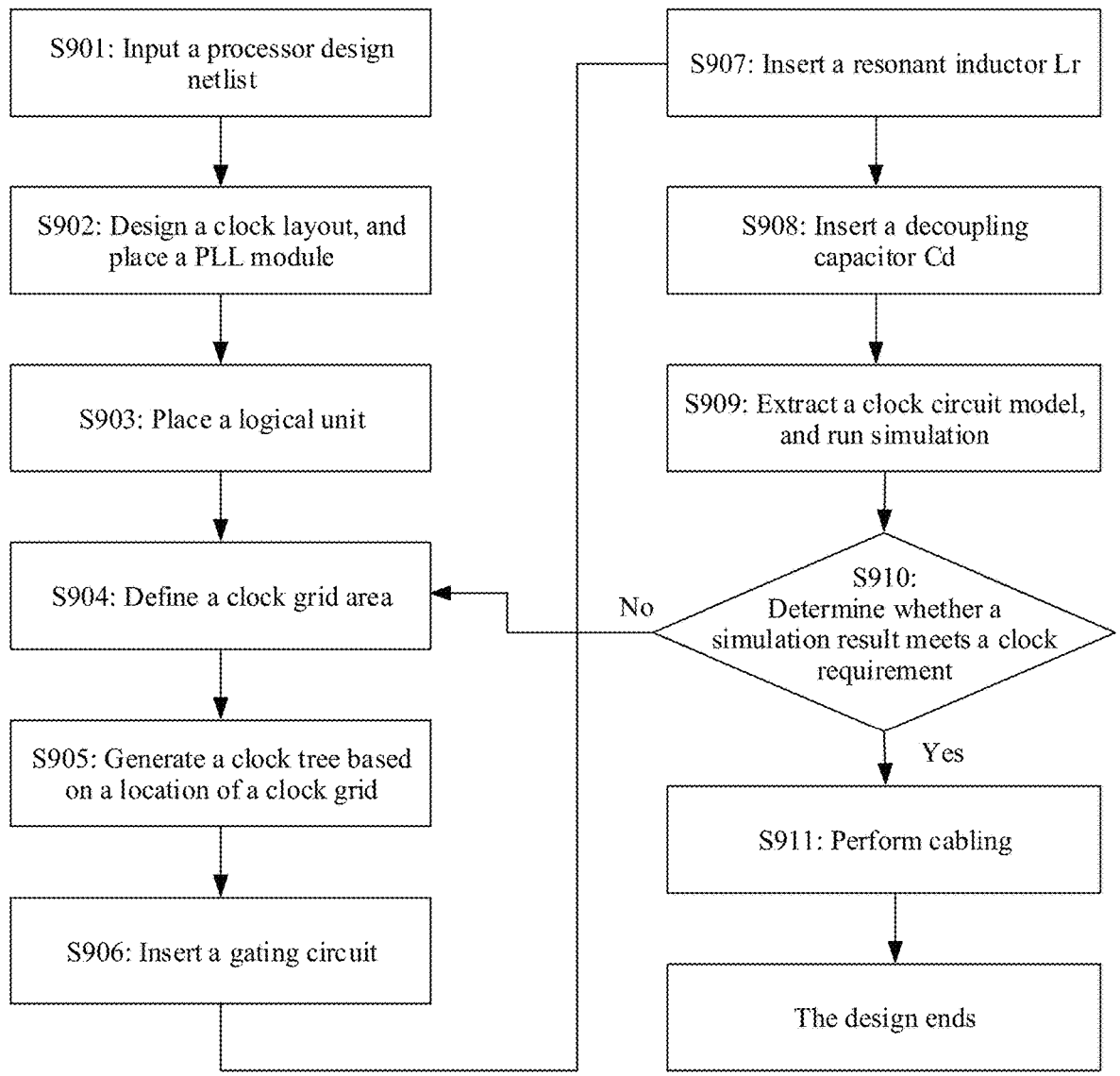
FIG. 9 is a schematic flowchart of a method for designing a layout of a child node circuit 400 and running simulation according to an embodiment of this application.

FIG. 9 is a schematic flowchart of a method for designing a layout of a child node circuit 400 and running simulation according to an embodiment of this application. The method in FIG. 9 may be implemented by using circuit simulation software. As shown in FIG. 9, the method includes the following steps.

S901: Input a processor design netlist (netlist).
S902: Design a clock layout, and place a PLL module.
S903: Place a logical unit.
S904: Define a clock grid area.
S905: Generate a clock tree based on a location of a clock grid.
S906: Insert a gating circuit.
S907: Insert a resonant inductor Lr.
S908: Insert a decoupling capacitor Cd.
S909: Extract a clock circuit model, and run simulation.
S910: Determine whether a simulation result meets a clock requirement.
If no, step S4 is performed. If yes, S11 is performed.
S911: Perform cabling.

Figure 10:
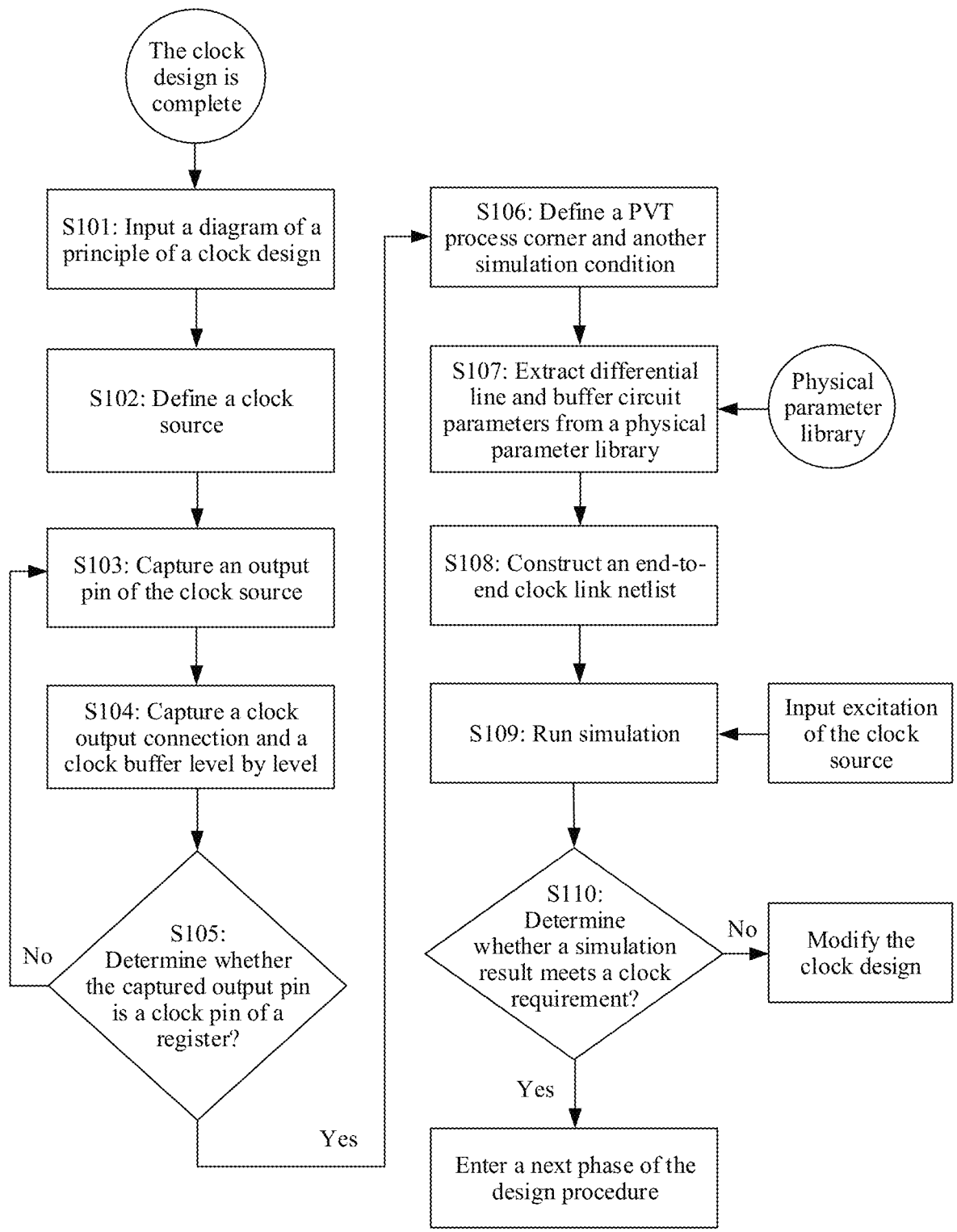
FIG. 10 is a schematic diagram of a method for extracting a clock circuit model and running simulation according to an embodiment of this application.

FIG. 10 is a schematic diagram of a method for extracting a clock circuit model and running simulation according to an embodiment of this application. The method in FIG. 10 may be implemented by using circuit simulation software. FIG. 10 shows a specific procedure of step S10 in FIG. 9. As shown in FIG. 10, the method includes the following steps.

S101: Input a diagram of a principle of a clock design.
The foregoing diagram of the principle of the clock design may be, for example, register transfer level (register transfer level, RTL) netlist code (netlist code). An RTL is an abstract level of logic design, and uses hardware description language to describe an ideal function.
S102: Define a clock source.
S103: Capture an output pin of the clock source.
S104: Capture a clock output connection and a clock buffer level by level.
S105: Determine whether the captured output pin is a clock pin of a register.
If yes, S106 is performed. If no, S103 is performed.
S106: Define a PVT process corner and another simulation condition.
The PVT process corner is a program-voltage-temperature process corner (PVT process corner). The PVT process corner indicates voltage and temperature conditions that need to be met in a simulation design.
S107: Extract differential line and buffer circuit parameters from a physical parameter library.
For example, the extracting differential line and buffer circuit parameters includes: extracting the parameters by using an RLC simulation program with integrated circuit emphasis (simulation program with integrated circuit emphasis, SPICE) model (model). SPICE indicates a circuit-level simulation program.
S108: Construct an end-to-end clock link netlist.
For example, the constructing an end-to-end clock link netlist includes: constructing the netlist by using the RTL SPICE model.
S109: Output excitation of the clock source, and run simulation.
For example, the outputting excitation of the clock source may include: setting a frequency, a clock jitter (jitter), and a slew rate (slew rate) of a clock source signal. The clock jitter may be a deviation between a timing event of a signal and an ideal location of the timing event.
The slew rate may also be referred to as a voltage conversion rate, and may be an amplitude of a voltage rise in a time unit.
S110: Determine whether a simulation result meets a requirement. If yes, the simulation ends. If no, the clock design is modified, and S101 is performed to perform clock design simulation again.

Optionally, a clock tree may be designed by using a differential circuit. The differential clock tree has a strong anti-noise capability, low power consumption, and a long drive distance for a load.

In addition, an embodiment of this application further provides an electronic device. A three-dimensional clock circuit architecture is disposed on the electronic device, so that clock performance can be improved. The three-dimensional clock architecture may include the clock circuit 300 described above, or the three-dimensional clock circuit architecture may include another type of clock circuit. The foregoing electronic device may be of a multi-die stacked package structure. The multi-die stacked package structure allows stacking of a plurality of dies, and provides a signal connection of the plurality of dies in a vertical direction by using a through silicon via (through silicon via, TSV). In some examples, the electronic device may be a processor.

Optionally, the foregoing three-dimensional clock architecture may obtain an optimal benefit, for example, a smaller clock jitter or a smaller clock skew, with reference with a many-core system on chip (system on chip, SoC) such as a two-dimensional mesh (2D mesh) or a three-dimensional integrated circuit (3DIC), and with reference to a new method and a new process. The new process may include chip-on-wafer-on-substrate (chip-on-wafer-on-substrate, CoWoS) package, fan-out package (fan-out package, FOP), three-dimensional integrated circuit through silicon via (3DIC TSV, 3D TSV) package, and the like.

Figure 11:
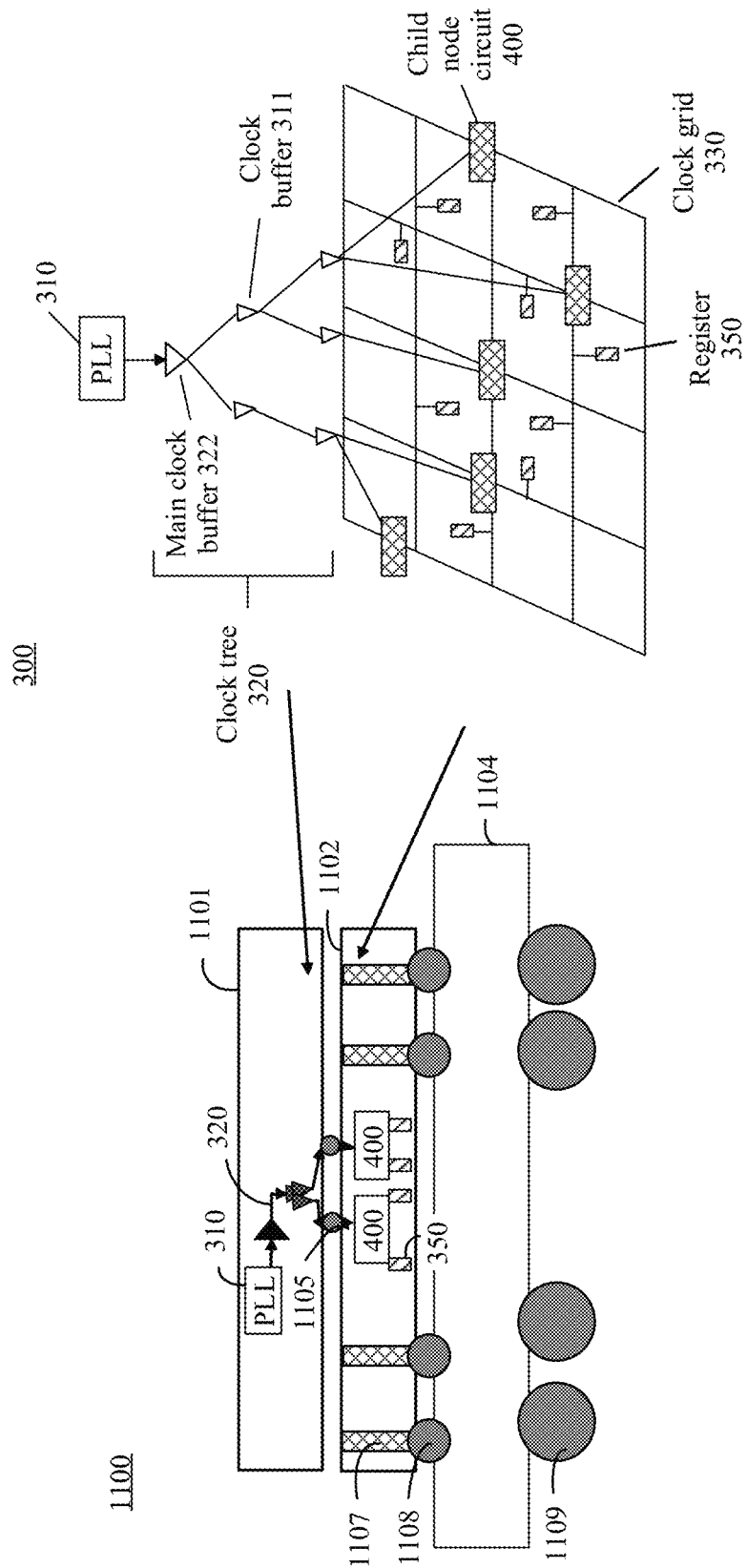
FIG. 11 is a diagram of a topology design of an electronic device 1100 according to an embodiment of this application.

For example, FIG. 11 is a diagram of a topology design of an electronic device 1100 according to an embodiment of this application. The electronic device 1100 uses a 3D topology of a 3DIC TSV. The 3DIC TSV means that a plurality of dies are stacked together for packaging, and high-speed and efficient data communication between the dies is implemented by using a through silicon via (through silicon via, TSV).

As shown in FIG. 11, the electronic device includes a first die 1101, a second die 1102, and a substrate 1104. The second die 1102 is disposed below the first die 1101, and the substrate 1104 is disposed below the second die 1102.

A plurality of micro solder balls 1105 are disposed on a lower surface of the first die 1101, and the first die 1101 is electrically connected to the second die 1102 by using the plurality of micro solder balls 1105.

A plurality of through silicon vias 1107 penetrating the second die 1102 are disposed on the second die 1102, a plurality of solder balls 1108 are disposed on a lower surface of the second die 1102, the plurality of through silicon vias 1107 are connected to the plurality of solder balls 1108, and the second die 1102 is electrically connected to the substrate 1104 by using the plurality of through silicon vias 1107 and the plurality of solder balls 1108.

A ball grid array 1109 is disposed on a lower surface of the substrate 1104, and the ball grid array 1109 is configured to connect the substrate 1104 to a printed circuit board (printed circuit board, PCB) (not shown in FIG. 11).

The substrate 1104 may also be referred to as a package substrate, or a substrate, and provides mechanical support, protection, heat dissipation, and an electrical connection channel for a die. A line is disposed on the substrate 1104 to conduct a signal between the first die 1101, the second die 1102, and the PCB. The substrate 1104 may be connected to an external pin of a processor by using a bonding wire, and the ball grid array 1109 of the substrate 1104 may be configured to connect a packaged processor to a PCB mainboard.

Optionally, the clock circuit (100, 200, 300) described above may be disposed on the electronic device 1100, or a clock circuit of another type may be disposed on the electronic device 1100. The PLL (110, 210, 310) and the clock tree (110, 220, 320) in the clock circuit may be disposed on the first die 1101. The clock grid (230, 330) and the register (150, 250, 350) in the clock circuit may be disposed on the second die 1102.

As shown in FIG. 11, for example, the PLL 310 and the clock tree 320 in the clock circuit 300 may be disposed on the first die 1101, and the clock grid 330 in the clock circuit 300 may be disposed on the second die 1102. The clock grid 330 includes a plurality of registers 350. The clock grid 330 includes a plurality of nodes, and some of the plurality of nodes each may be provided with the child node circuit 400, or may not be provided with the child node circuit 400.

In an example, the clock tree 320 includes a plurality of levels of clock buffers 311, and a last level of clock buffer in the plurality of levels of clock buffers 311 is connected to a plurality of child node circuits 400 in the clock grid 330 by using the plurality of micro solder balls 1105.

Optionally, the first die 1101 may include a logic die or a memory die (logic & memory die). The second die 1102 may include a logic die (logic die).

Optionally, the electronic device in FIG. 11 may be a processor.

In an example, a die architecture design procedure of the electronic device in FIG. 11 may be described as follows: The die architecture design process may be implemented by using electronic design automation (electronic design automation, EDA) software.

(1) Clock Design of the Second Die
  S501: Generate a clock grid based on placement density and locations of registers.
  S502: Place a child node circuit 400 based on the locations of the registers in the clock grid, and connect the child node circuit 400 to a clock grid node.
  S503: Insert a through silicon via at a placement location of the child node circuit 400, where the through silicon through via is connected to the child node circuit 400, and is configured to connect to a circuit of the first die.

(2) Clock Design of the First Die
  S601: Place a sink (sink) clock buffer at a location of a through silicon via, where the sink clock buffer is a sink of a clock circuit of the first die.
  S602: Determine a placement location of a PLL based on a layout requirement of the first die and a location of the sink clock buffer.
  S603: Generate a clock tree based on the locations of the PLL and the sink clock buffer.
  S604: Connect various levels of buffers of the clock tree to each other.

Figure 12:
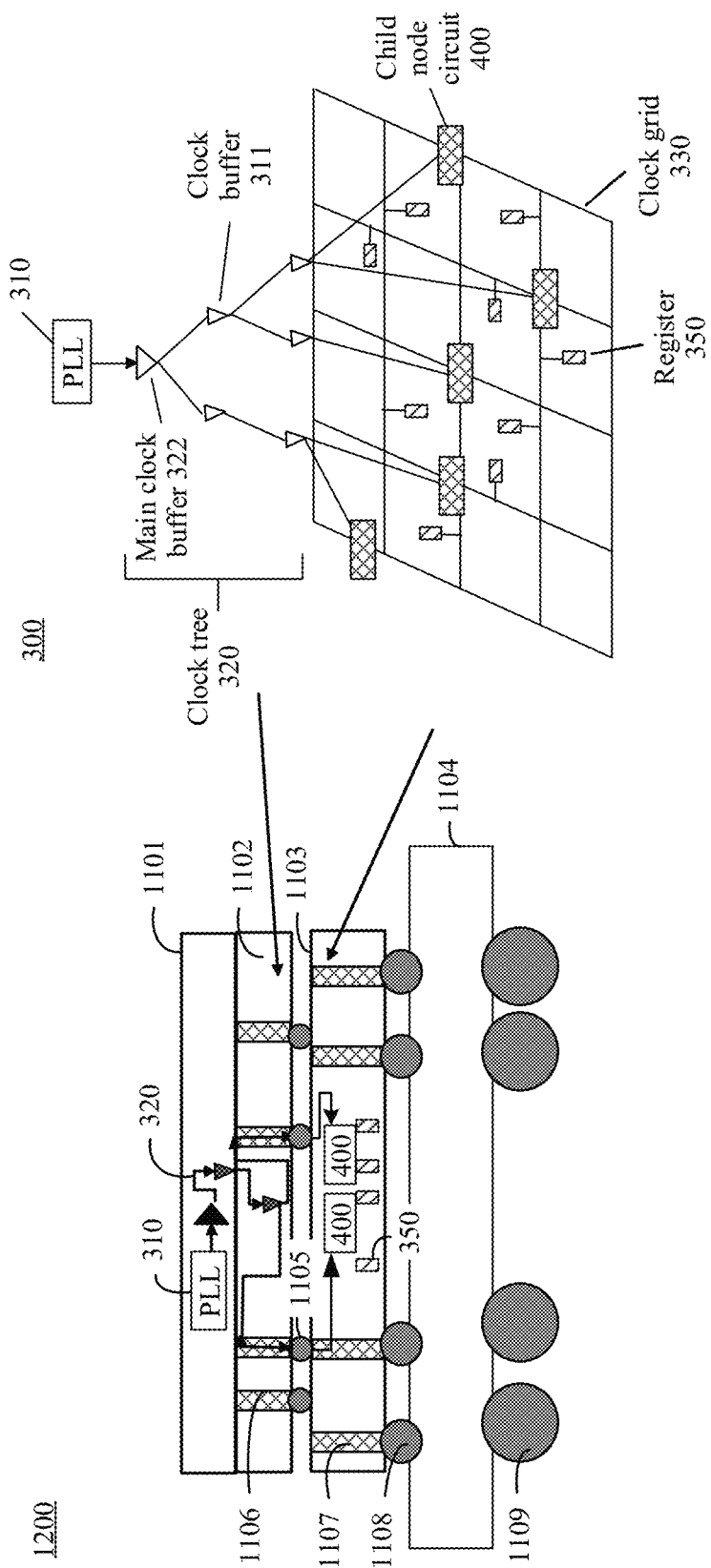
FIG. 12 is a diagram of a topology design of an electronic device 1200 according to another embodiment of this application.

FIG. 12 is a diagram of a topology design of an electronic device 1200 according to another embodiment of this application. The electronic device 1200 may include more dies than that in FIG. 11. As shown in FIG. 12, the electronic device 1200 sequentially includes a first die 1101, a second die 1102, a third die 1103, and a substrate 1104 from top to bottom. For brevity, content in FIG. 12 that is the same as or similar to that in FIG. 11 is not described herein again.

As shown in FIG. 12, the second die 1102 is disposed below the first die 1101, and is electrically connected to the first die 1101. For example, the first die 1101 and the second die 1102 may be bonded in a physical or chemical manner.

A plurality of first through silicon vias 1106 are disposed on the second die 1102. A plurality of micro solder balls 1105 are disposed on a lower surface of the second die 1102, and the second die 1102 is electrically connected to a third die 1103 by using the plurality of first through silicon vias 1106 and the plurality of micro solder balls 1105.

A plurality of second through silicon vias (through silicon via, TSV) 1107 penetrating the third die 1103 are disposed on the third die 1103, a plurality of solder balls 1108 are disposed on a lower surface of the third die 1103, the plurality of second through silicon vias 1107 are connected to the plurality of solder balls 1108, and the third die 1103 is electrically connected to the substrate 1104 by using the plurality of second through silicon vias 1107 and the plurality of solder balls 1108.

A ball grid array 1109 is disposed on a lower surface of the substrate 1104, and the ball grid array 1109 is configured to connect the substrate 1104 to a PCB (not shown in FIG. 12).

Optionally, the clock circuit (100, 200, 300) described above may be disposed on the electronic device 1200, or a clock circuit of another type may be disposed on the electronic device 1200. The PLL (110, 210, 310) and a part of the clock tree (110, 220, 320) in the clock circuit may be disposed on the first die 1101. The other part of the clock tree (110, 220, 320) may be disposed on the second die 1102. The clock grid (230, 330) and the register (150, 250, 350) in the clock circuit may be disposed on the third die 1103.

As shown in FIG. 12, for example, the PLL 310 and a part of the clock tree 320 in the clock circuit 300 may be disposed on the first die 1101, and the other part of the clock tree 320 may be disposed on the second die 1102. The clock grid 330 in the clock circuit 300 may be disposed on the third die 1103. The clock grid 330 includes a plurality of registers 350. The clock grid 350 includes a plurality of nodes, and some of the plurality of nodes each may be provided with the child node circuit 400, or may not be provided with the child node circuit 400.

In an example, the clock tree 320 includes a plurality of levels of clock buffers 311, and a last level of clock buffer in the plurality of levels of clock buffers 311 is connected to a plurality of child node circuits 400 in the clock grid 330 by using the plurality of first through silicon vias 1106 and the plurality of micro solder balls 1105 in the second die 1102.

Optionally, the first die 1101 and the second die 1102 each may include a logic die or a memory die (logic & memory die). The third die 1103 may include a logic die (logic die).

Optionally, the electronic device 1200 in FIG. 12 may be a processor.

Figure 13:
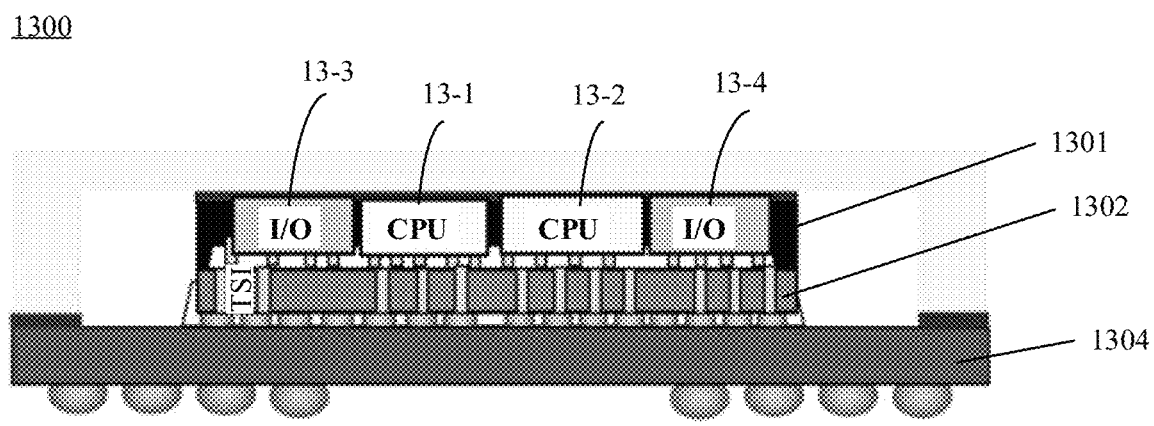
FIG. 13 is a diagram of a topology design of an electronic device 1300 according to another embodiment of this application.

FIG. 13 is a diagram of a topology design of an electronic device 1300 according to another embodiment of this application. The topology design is based on a chiplet architecture. The chiplet architecture may also be referred to as a Lego (Lego)-style architecture, and may use chip-on-wafer-on-substrate (chip-on-wafer-on-substrate, CoWoS) package or fan-out package (fan-out package, FOP). Optionally, the electronic device 1300 may be a processor.

A CoWoS is a 2.5-dimensional integrated packaging technology. A packaging process of the CoWoS is as follows: A semiconductor die is first connected to a wafer through a chip on wafer (CoW) packaging process, and then a CoW is connected to a substrate, to obtain a CoWoS through integration. In this packaging manner, a plurality of dies can be packaged together, achieving effects of a small package size, low power consumption, and few pins.

FOP connects dies with different functions to passive devices by using a rerouting layer, to reduce a package size. Heterogeneous dies can be integrated into a single package to balance costs and performance.

FOP mainly includes fan-out-wafer-level-package (fan-out-wafer-level-package, FOWLP) and fan-out-panel-level-package (fan-out-panel-level package, FOPLP).

As shown in FIG. 13, the electronic device 1300 includes a first die layer 1301, a second die layer 1302, and a substrate 1304. The first die layer 1301 may include a plurality of dies, and the plurality of dies are interconnected at a high speed by using an intermediate medium (interposer). In FIG. 13, an example in which the first die layer 1301 includes two central processing unit (central processing unit, CPU) dies (13-1, 13-2) and two I/O dies (13-3, 13-4) is used for description.

An independent clock network is set inside each of the two CPU dies (13-1, 13-2). The clock network inside each CPU die (13-1, 13-2) may be the clock circuit (100, 200, 300) described above, or may be a clock circuit of another type. In an example, the PLL (110, 210, 310) and the clock tree (110, 220, 320) in the clock circuit may be disposed on the CPU die (13-1, 13-2). The clock grid (230, 330) and the register (150, 250, 350) in the clock circuit may be disposed on the second die layer 1302.

Figure 14:
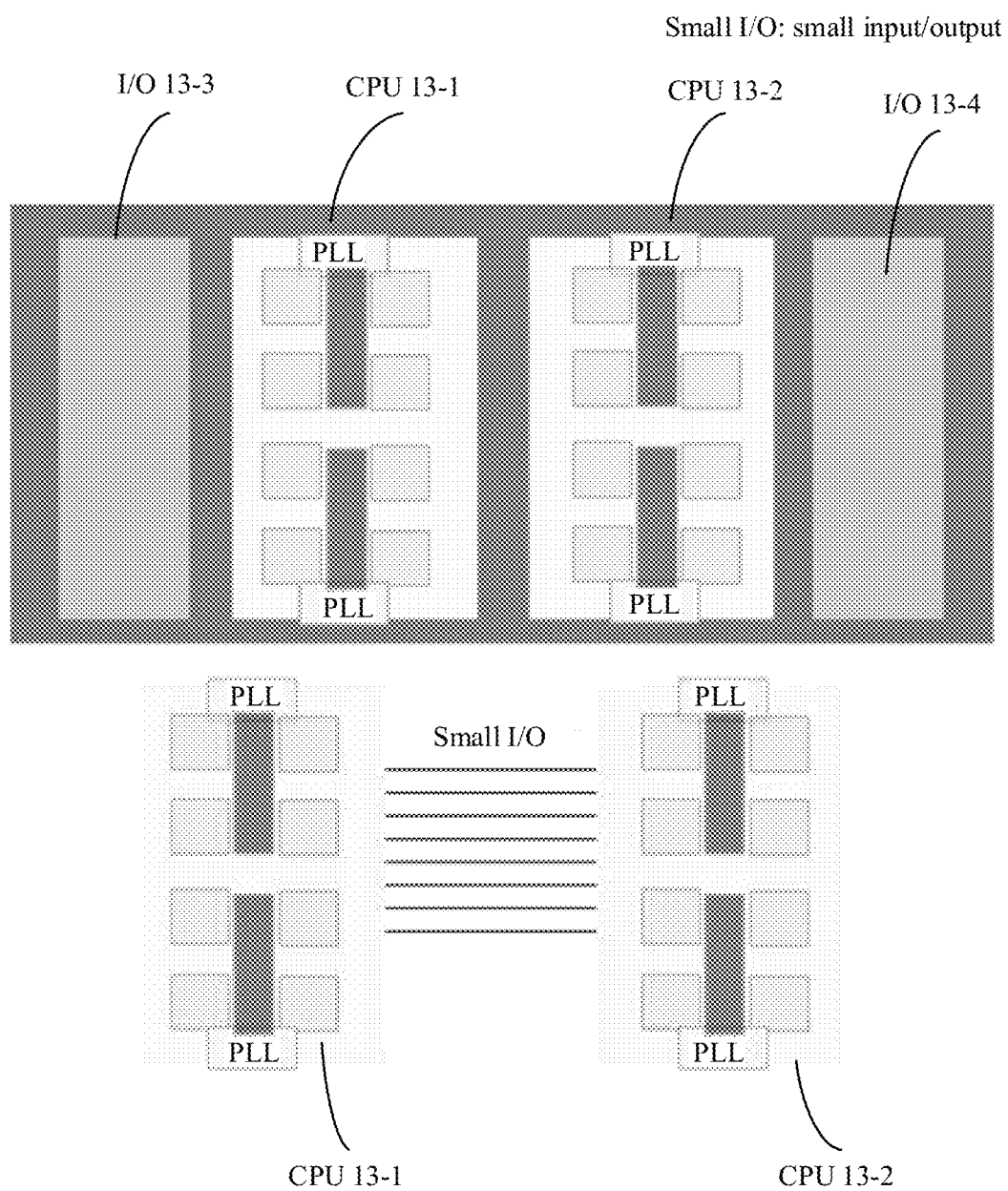
FIG. 14 is a schematic diagram of interconnection between dies of the electronic device 1300 in FIG. 13.

The CPU dies (13-1, 13-2) are connected by using a clock signal in a high-density and high-speed interconnection manner. For example, FIG. 14 is a schematic diagram of interconnection between CPU dies in FIG. 13. As shown in FIG. 14, the foregoing high-density and high-speed interconnection manner may use, for example, a small input/output (small input/output, small I/O) technology.

It should be noted that the first die, the second die, and the third die in the foregoing figures and embodiments are dies (dies). In a possible implementation solution, the first die, the second die, and the third die each include one or more dies.

A clock design solution of the electronic device 1300 in FIG. 13 includes the following steps:

S801: Generate a clock grid based on placement density and locations of registers. There may be one or more clock grids.

S802: Place a child node circuit 400 based on the locations of the registers in the clock grid, and connect the child node circuit 400 to a clock grid node.

S803: Determine a placement location of a PLL based on a layout requirement of the die and a location of the child node circuit 400.

S804: Generate a clock tree based on the locations of the PLL and the child node circuit 400, and determine locations of various levels of clock buffers.

S805: Connect the various levels of buffers of the clock tree to each other.

S806: If a plurality of dies need to share a clock source design, inter-die clock signals are connected to each other in a high-speed interconnection manner between dies.

A person of ordinary skill in the art may be aware that, in combination with the examples described in embodiments disclosed in this specification, units and algorithm steps may be implemented by electronic hardware or a combination of computer software and electronic hardware. Whether the functions are performed by hardware or software depends on particular applications and design constraints of the technical solutions. A person skilled in the art may use different methods to implement the described functions for each particular application, but it should not be considered that the implementation goes beyond the scope of this application.

A person skilled in the art may clearly understand that, for the purpose of convenient and brief description, for a detailed working process of the foregoing system, apparatus, and unit, refer to a corresponding process in the foregoing method embodiments. Details are not described herein again.

In the several embodiments provided in this application, it should be understood that the disclosed system, apparatus, and method may be implemented in other manners. For example, the described apparatus embodiments are merely examples. For example, division into units is merely logical function division and may be other division in an actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, and may be located in one position, or may be distributed on a plurality of network units. Some or all of the units may be selected depending on actual requirements to achieve the objectives of the solutions in the embodiments.

In addition, the functional units in the embodiments of this application may be integrated into one processing unit, or each of the units may exist alone physically, or two or more units may be integrated into one unit.

When the functions are implemented in a form of a software functional unit and sold or used as an independent product, the functions may be stored in a computer-readable storage medium. Based on such an understanding, the technical solutions of this application essentially, or the part contributing to the conventional technology, or some of the technical solutions may be implemented in a form of a software product. The computer software product is stored in a storage medium, and includes several instructions for instructing a computer device (which may be a personal computer, a server, or a network device) to perform all or some of the steps of the methods described in the embodiments of this application. The foregoing storage medium includes any medium that can store program code, a USB flash drive, a removable hard disk, a read-only memory (read-only memory, ROM), a random access memory (random access memory, RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A clock circuit in a processor integrated circuit, comprising:
   a phase lock loop (PLL);
   a clock tree; and
   a clock grid,
   wherein the PLL is configured to output a first clock signal clk_1, the clock tree is configured to receive the first clock signal clk_1 from the PLL and output a second clock signal clk_2, the clock grid comprises a plurality of nodes, each node in a subgroup of the plurality of nodes being provided with a child node circuit connected to the clock tree and configured to generate a third clock signal clk_3 based on the second clock signal clk_2, and
   wherein the clock grid and the clock tree are distributed on multiple dies in a three-dimensional structure of the processor integrated circuit;
   wherein the child node circuit comprises a resonant and decoupling unit and a clock gating unit, the clock gating unit being configured to receive a gating signal G and the second clock signal clk_2 and output the third clock signal clk_3, and wherein the resonant and decoupling unit is configured for generating a plurality of oscillation frequencies of different frequencies.

2. The clock circuit according to claim 1, wherein the resonant and decoupling unit comprises a plurality of resonant inductor circuits connected in parallel, a plurality of switch circuits, and a decoupling capacitor, wherein the plurality of resonant inductor circuits are in a one-to-one correspondence with the plurality of switch circuits, and resonant inductors are separately disposed on the plurality of resonant inductor circuits.

3. The clock circuit according to claim 2, wherein a first switch circuit of the plurality of switch circuits is configured to receive a switch control signal S for controlling the first switch circuit to be in an on state or an off state.

4. The clock circuit according to claim 2, wherein the plurality of resonant inductor circuits correspond to a plurality of clock domains.

5. The clock circuit according to claim 2, wherein a first end of the decoupling capacitor is configured to receive the third clock signal clk_3, and a second end of the decoupling capacitor is configured to be connected to a power supply or the ground.

6. The clock circuit according to claim 1, wherein the child node circuits are further connected to a plurality of registers by the clock grid.

7. An integrated circuit comprising:
   a first die;
   a second die disposed below the first die; and
   a substrate disposed below the second die,
   wherein a plurality of micro solder balls are disposed on a lower surface of the first die, and
   the first die is electrically connected to the second die by using the plurality of micro solder balls,
   wherein a plurality of through silicon vias penetrating the second die are disposed on the second die, a plurality of solder balls are disposed on a lower surface of the second die, and the plurality of through silicon vias are connected to the plurality of solder balls, wherein the second die is electrically connected to the substrate by the plurality of through silicon vias and the plurality of solder balls, and
   wherein a clock circuit is disposed in the integrated circuit and comprises:
   a phase lock loop (PLL), configured to output a first clock signal clk_1;
   a clock tree, configured to: receive the first clock signal clk_1, and output a second clock signal clk_2; and
   a clock grid connected to a plurality of registers, wherein the clock grid is configured to receive the second clock signal clk_2, and output a third clock signal clk_3 to the plurality of registers, and wherein the PLL and the clock tree are disposed on the first die, and the clock grid is disposed on the second die;

wherein the clock grid comprises a plurality of nodes, each node in a subgroup of the plurality of nodes being provided with a child node circuit connected to the clock tree, and the clock tree comprises a plurality of levels of clock buffers, and a last level of clock buffer in the plurality of levels of clock buffers is connected to a plurality of child node circuits in the clock grid by the plurality of micro solder balls.

8. The integrated circuit according to claim 7, wherein the integrated circuit is a processor integrated circuit.

9. An integrated circuit comprising:

a first die;

a second die disposed below the first die and electrically connected to the first die;

a third die disposed below the second die; and a substrate disposed below the third die, wherein a plurality of first through silicon vias are disposed on the second die, a plurality of micro solder balls are disposed on a lower surface of the second die, and the second die is electrically connected to the third die by the plurality of first through silicon vias and the plurality of micro solder balls, wherein a plurality of second through silicon vias penetrating the third die are disposed on the third die, a plurality of solder balls are disposed on a lower surface of the third die, and the plurality of second through silicon vias are connected to the plurality of solder balls, and wherein the third die is electrically connected to the substrate by means of the plurality of second through silicon vias and the plurality of solder balls, wherein a clock circuit is disposed in the integrated circuit and comprises:

a phase lock loop (PLL), configured to output a first clock signal clk_1;

a clock tree configured to receive the first clock signal clk_1 and output a second clock signal clk_2; and a clock grid connected to a plurality of registers, wherein the clock grid is configured to receive the second clock signal clk_2 and output a third clock signal clk_3 to the plurality of registers, wherein the PLL and a first part of the clock tree are disposed on the first die, a second part of the clock tree is disposed on the second die, and the clock grid is disposed on the third die.

10. The integrated circuit according to claim 9, wherein the clock grid comprises a plurality of nodes, and each node in a subgroup of the plurality of nodes is provided with a child node circuit.

11. The integrated circuit according to claim 10, wherein the clock tree comprises a plurality of levels of clock buffers, and a last level of clock buffer in the plurality of levels of clock buffers is connected to a plurality of child node circuits in the clock grid by the plurality of first through silicon vias and the plurality of micro solder balls.

12. The integrated circuit according to claim 9, wherein the integrated circuit is a processor integrated circuit.

* * * * *